United States Patent [19]
Pilukaitis et al.

[11] Patent Number: 4,903,182
[45] Date of Patent: Feb. 20, 1990

[54] SELF-OSCILLATING CONVERTER WITH LIGHT LOAD STABILIZER

[75] Inventors: Raymond W. Pilukaitis, Stanhope; Khanh C. Tran, Parsippany; Thomas G. Wilson, Jr., Morristown, all of N.J.

[73] Assignee: American Telephone and Telegraph Company, AT&T Bell Laboratories. Murray Hill, N.J.

[21] Appl. No.: 325,751

[22] Filed: Mar. 20, 1989

[51] Int. Cl.[4] .............................................. H02M 3/335
[52] U.S. Cl. ........................................ 363/19; 363/97; 323/289
[58] Field of Search ................... 363/18, 19, 56, 95, 363/97, 131; 323/289

[56] References Cited

U.S. PATENT DOCUMENTS

| 4,605,998 | 8/1986 | Higashi | 363/19 |
| 4,605,999 | 8/1986 | Bowman et al. | 363/19 |
| 4,630,186 | 12/1986 | Kudo | 363/19 |

Primary Examiner—Peter S. Wong
Attorney, Agent, or Firm—Alfred G. Steinmetz

[57] ABSTRACT

A self oscillating converter with regenerative switching includes circuitry to enhance the gain of circuity to turn off a MOSFET power switch and enhance the regenerative action culminating in turn off in order to eliminate bursting at low loads. The MOSFET power switching device turn off circuitry includes the addition of a supplementary drive transistor operative for counteracting the effects of the parasitic capacitances of the MOSFET power switching device. This permits the converter to operate with the shorter on times and to provide a low ripple output at very low load.

7 Claims, 4 Drawing Sheets

SELF-OSCILLATING CONVERTER WITH LIGHT LOAD STABILIZER

FIELD OF THE INVENTION

This invention relates to self-oscillating power converts and is particularly concerned with these power converters having FET type power switches and operating at light load.

BACKGROUND OF THE INVENTION

Low power self-oscillating converters with FET type power switches tend to become operationally unstable when operating into a load that is very small with respect to its rated load (i.e. typically 10% or less of rated load). This unstable behavior is normally manifested as a low frequency oscillation called bursting in which the FET power switch operates for several switching cycles and then remains off for several cycles. The effect of the unstable behavior is to cause the ripple on the output voltage to increase significantly, frequently exceeding the specified output voltage ripple of the converter by an order of magnitude. This places restrictions on the load range over which such a selfoscillating converter may be operated and limits its range of applications.

This problem of bursting at light loads has been dealt with in the prior art by connecting a bleeder resistor across the output of the self-oscillating converter to artificially increase the load. Addition of the bleeder resistor however dissipates a considerable amount of power, reducing the efficiency of the self-oscillating converter and reduces its maximum power output capability.

SUMMARY OF THE INVENTION

A self-oscillating converter with regenerative switching includes circuitry embodying the principles of the invention to enhance turn off of the MOSFET power switching device by counteracting the effect of parasitic capacitances of the MOSFET power switching device on its primary turn off drive transistor in order to eliminate bursting at low loads. In the illustrative embodiment, a supplementary drive transistor is connected to discharge a parasitic gate-source capacitance of the MOSFET power switching device and counteract the miller effect of this parasitic gate-source capacitance on the turn off drive transistor. By using a supplementary drive transistor to enhance the discharge of the gate-source capacitance of the MOSFET power switching device, turn off of the MOSFET is enhanced, permitting it to operate with the shorter conduction intervals required to provide a low ripple output at very low load conditions.

DETAILED DESCRIPTION

Figure 1:
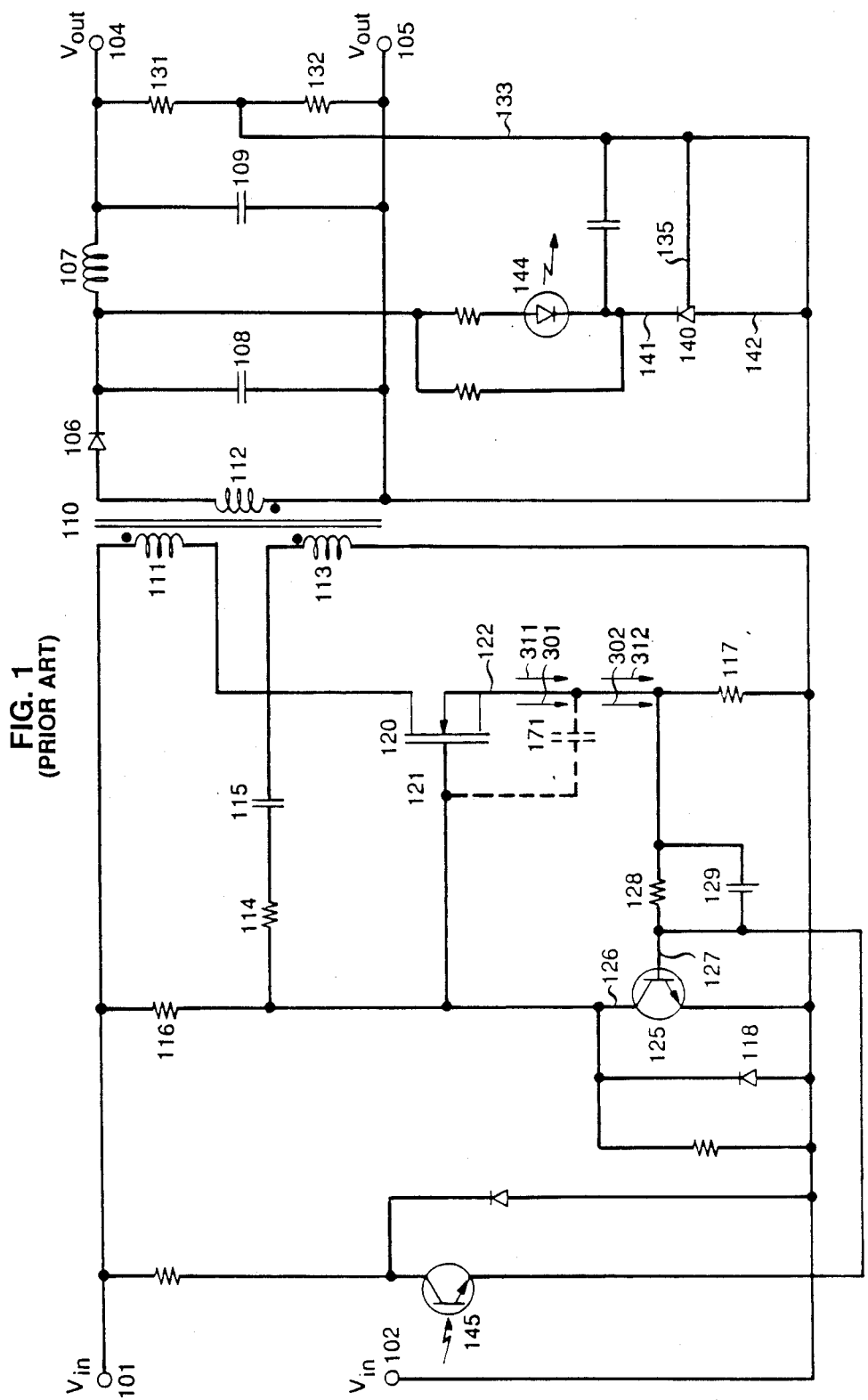
FIG. 1 is a schematic of a self-oscillating power converter according to the prior art which suffers from bursting at low loads.

A self-oscillating flyback power converter of the prior art is shown in FIG. 1. A DC voltage is applied to the input terminals 101 and 102 and is periodically applied to the primary winding 111 of the power transformer 110 by the periodic switching of the MOSFET power switching device 120. Energy is stored in th core of power transformer 110 during conduction of the MOSFET power s witching device 120. This stored energy is transmitted by the rectifying diode 106, which becomes forward biased during a non-conducting internal of the MOSFET power switching device 120. A filter circuit comprising an inductor 107 and two shunt capacitors 108 and 109 is included between the secondary winding 112 and the output terminals 104 and 105 to filter output ripple.

Periodic switching of the MOSFET power switching device 120 from nonconduction into conduction is in response to a regenerative feedback drive circuit, including a regenerative feedback winding 113 of the power transformer 110 and a series R-C network including resistor 114 and capacitor 115. The ringing induced by the magnetizing inductance of transformer 110 at the end of conduction of diode 106 is fed back trhough the R-C network and induces the periodic turn on of the MOSFET power switching device. The periodic turn off of the MOSFET power switching device 120 is in response to voltage regulation circuitry which embodies peak current control techniques as described below. Turnoff of the MOSFET power switching device 120 is directly controlled by a bipolar transistor 125 whose collector 126 is connected to the gate electrode 121 of the MOSFET power switching device 120. The voltage regulation signal causes this transistor 125 to turn on and hence initiate a turn off of the MOSFET power switching device 120. Initial start up of the converter is provided through resistor 116 which couples the input terminal 101 to the gate electrode 121 of the MOSFET power switching device 120.

The regenerative feedback current supplied by regenerative feedback winding 113 to initiate conduction in the MOSFET power switching device 120 is coupled, via the series R-C network comprising resistor 114 and capacitor 115, to a node common to the collector 126 of the turn off transistor 125 and the gate 121 of the MOSFET power switching device 120. During the interval when the secondary winding 112 supplies an output current through the rectifying diode 106 to the output terminal 104, the voltage across winding 112, as reflected into regenerative feedback winding 113, charges the right hand plate of the capacitor 115 to the voltage across winding 113. Charging current coupled through diode 118 charges the left plate of capacitor 115 to the voltage level of terminal 102. At the end of the energy discharge of winding 112 a ringing action is induced due to the charged parasitic capacitances (mostly from the FET power switch and the transformer winding) in the circuit resonating with the magnetizing inductance.

This ringing surge drives the left hand plate of capacitor 115 to the threshold turn on voltage of the MOSFET power switching device 120. Current flow through the MOSFET power switching device 120 and winding 11 results in a regenerative voltage across winding 113 which is applied via the capacitor 115 to drive the MOSFET power switching device 120 further into conduction.

Regulation of the DC output voltage at output terminals 104 and 105 is controlled by a voltage regulation feedback circuit which operates through a peak current control arrangement. The termination of a conduction interval of the MOSFET power switching device 120 is responsive to attainment of the sum of a controlled current threshold in the low value current sensing resistor 117 and a feedback error voltage applied to capacitor 129 from phototransistor 145. The voltage across this resistor 117 and across capacitor 129 is summed and coupled to the base electrode 127 of the bipolar transistor 125. When the sum of voltage across resistor 117 and capacitor 129 reaches the base-emitter turn-on threshold (approximately 0.6 Volts for a typical transistor), the bipolar transistor 125 is biased into conduction and, by discharging the source-gate capacitance of the MOSFET power switching device 120, biases it into a non-conducting state. To a first order approximation (assuming the time for the ringing at the end of secondary winding conduction is small compared to the conduction time of the power transistor 120 and diode 106), th duty cycle is constant for constant input and output voltages and load regulation is achieved by frequency variation.

The voltage regulation feedback circuit monitors the output voltage and applied a current to the base electrode 127 of the bipolar transistor 125, generating a voltage across resistor 128 and the capacitor 129. This voltage is superimposed on the voltage sensed across the current sensing resistor 117 which voltage is generated is response to current flowing through the MOSFET power switching device 120. The DC output voltage is sensed from a voltage divider comprising resistors 131 and 132 connected across the output terminals 104 and 105. This sensed voltage is coupled by lead 133 to the reference control lead 135 of a precision voltage device 140 which is sometimes popularly designated as a programmable precision reference. In operation the precision voltage device 140 becomes operative as a current sink at its cathode 141 whenever its reference control lead 135 to anode terminal 142 voltage exceeds a threshold value. These devices are readily available commercially and it is not believed necessary to describe them in detail. The reference control lead 135 and anode terminal 141 are shunted by a rsistor 132 which is part of the voltage divider shunting the output terminals 104 and 105. If the output voltage exceeds its regulated value, the voltage across resistor 132 activates the precision voltage device 140. Current is drawn from the filter capacitor 108 through the light emitting diode 144. Emitted light from diode 144 enables photo transistor 145 to couple current from input terminal 101 to node 127, generating a voltage across the capacitor 129 and the resistor 128. This voltage is superimposed on the voltage sensed across resistor 117 and hence permits regulation of the output voltage as well as current limiting.

Self-oscillating DC-DC converters of the type as shown in FIG. 1 tend to develop low frequency oscillations or bursts of the switching cycles (i.e. normally identified as a bursting phenomena) at light load (i.e. approximately equal to or less than 10 percent of rated load). The MOSFET power switching device 120 with its regenerative switch drive, oscillates irregularly due to the limited rate of increase of collector current of its turn off drive transistor 125. This irregularity of oscillation causes significant ripple in the DC output voltage (i.e. this ripple normally exceeds specified ripple by greater than an order of magnitude).

At normal and heavy loads, for example, the turn off drive transistor 125 has sufficient time to fully discharge the gate capacitance of the MOSFET power switching device 120. The rate at which the discharge current through the gate-source capacitor 171 can increase is limited by the rate at which the current flow through MOSFET power switching device 120 and hence the sensing resistor 117 increases.

At very low power loads it is necessary to reduce the on time of the MOSFET power switching device 120 to a very small time interval in each cycle in order to regulate the output. This short conduction interval requires a swift discharge of the capacitor 115 and the parasitic gate-source capacitor 171. The rate of collector current increase in the turn off transistor 125 does not permit a fast discharge of the gate-source capacitance 171. Gate-source capacitance 171 of the MOSFET power switching device 120 is essentially shunted across the base collection junction of the turn off transistor 125 and operates effectively as a large miller capacitance for transistor 125. Hence the current drive through resistors 117 and 128 and capacitor 129 to bias the turn on of the turn off transistor 125 is diverted by the gate-source capacitor 171 slowing down its turn on.

Figure 3:
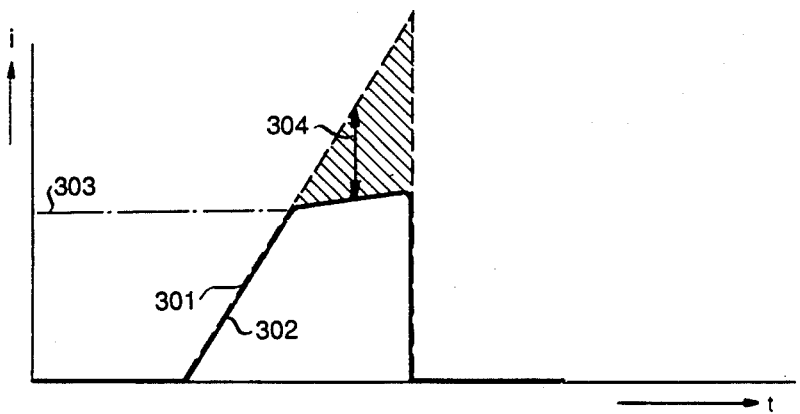
FIG. 3 shows voltage waveforms representing current flow in various components of the converter of FIG. 1.

An understanding of this phenomenon may be readily attained by reference to the current and voltage waveforms disclosed in FIG. 3. FIG. 3 discloses the current flow through the ideal MOSFET power switching device 120 as shown by dotted line 301 (essentially the primary winding current) and the actual source current as shown by solid line 302. The difference between these currents is the current flowing into the parasitic MOSFET capacitance 171. The traces of current waveforms 301 and 302 are substantially coincident until a threshold level 303 is attained which represents the current level that biases the base-emitter junction of transistor 125 significantly into conduction. This sudden decrease in the rate of current increase occurs because slight increases in the base-emitter voltage of transistor 125 increases the collector current of transistor 125 dramatically. Much of this collector current discharges the gate voltage by discharging the gate-source capacitor 171, thereby diverting the internal MOSFET current 301. The difference current shown by line 304 is the current that is diverted in order to discharge the gate-source capacitor 171. The slope of the source current waveform 302 during this discharge period is determined by transistor parameters and would have a zero slope with an ideal transistor 125 (zero base-emitter resistance and infinite beta).

Figure 4:
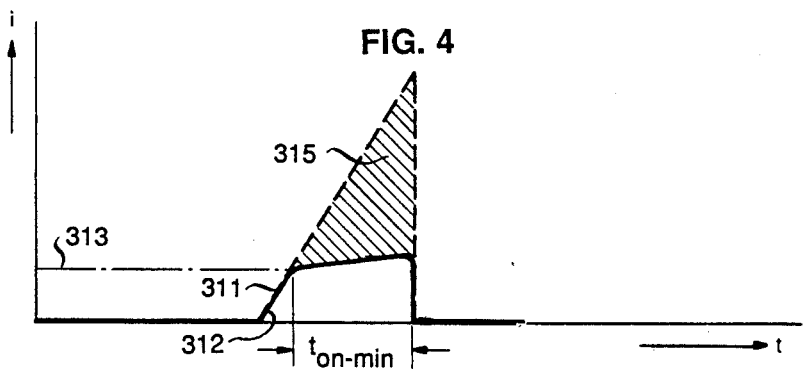
FIG. 4 shows voltage waveforms representing current flow in various components of the converter of FIG. 1.
Figure 5:
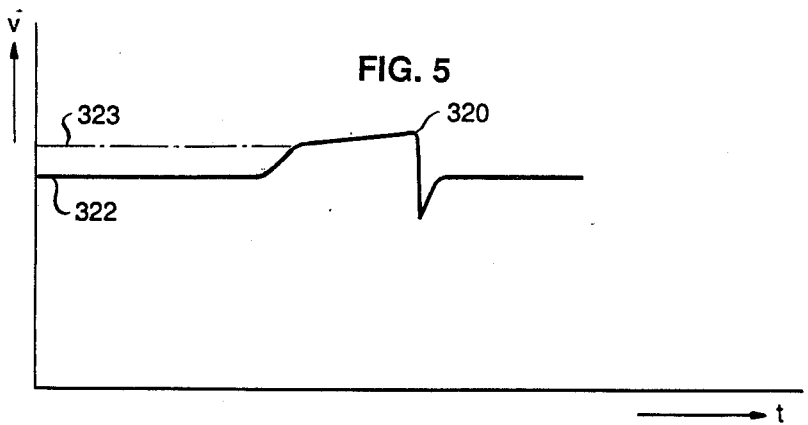
FIG. 5 shows voltage waveforms representing current flow in various components of the converter of FIG. 1.

At very low loads the duration of the current flow through the MOSFET power switching device 120 is considerably shortened, while the charge needed to change the voltage across the gate-source capacitance remains a constant value. This light load condition is shown in FIG. 4. The current 311 which flows through the ideal MOSFET power switching device 120 and the actual source current 312 which mostly flows through current sensing resistor 117 are substantially coincident only to the attainment of a much smaller current threshold 313. The gate-source capacitor is discharged by the difference between these two currents. Note that the amount of charge required to discharge the capacitor, indicated by shaded area 315, is, to a first order approximation, independent of load. That is, the amount of charge represented by the shaded area in FIG. 4 (the light load waveform) is approximately the same as that in FIG. 3 (the heavy load waveform). This results in the minimum on time indicated by $t_{on-min}$ in FIG. 4. The waveform for the base-emitter voltage of the turn-off transistor 125, corresponding to the light load condition in FIG. 4, is shown in FIG. 5. When transistor 120 is off, the base-emitter voltage equals the control voltage across capacitor 129, nearly a constant value 322 during this off time. After transistor 120 turns on, the base-emitter voltage ramps up to a level 323 at which collector current begins to become significant. The base-emitter voltage stays near this level due to the Miller effect until turn off of transistor 120 at point 320.

This converter self oscillates through regenerative action and operates at a frequency determined by the load. At light load the conduction interval of MOSFET power switching device 120 is very short. With further reductions in load, the threshold level 313 will approach zero, and the on time will need to be less than $t_{on-min}$. Correspondingly, leve 322 will approach level 323 and the turn off transistor 125 will be conducting beyond the entire on time of the MOSFET power switching device 120 and the conduction interval of turn off transistor 125 continues into the ringing interval of the s econdary winding 112. This can prevent the turn on of the MOSFET power switching device 120 during the ringing interval of the winding 112, causing the MOSFET power switching device 120 to remain off until the start up resistor 116 charging the gate capacitances biases the MOSFET power switching device 120 into conduction. This failure to periodically turn on except by the start up process may proceed for a time much longer than the full load switching cycle, (i.e. the longest conducting interval) which is normally many successive cycles. This state continues until the regular switching process may again assert itself. After several regenerative switching cycles the MOSFET power switching device 120 will again turn off for several successive switching cycles. This phenomenon is sometimes called bursting.

Figure 2:
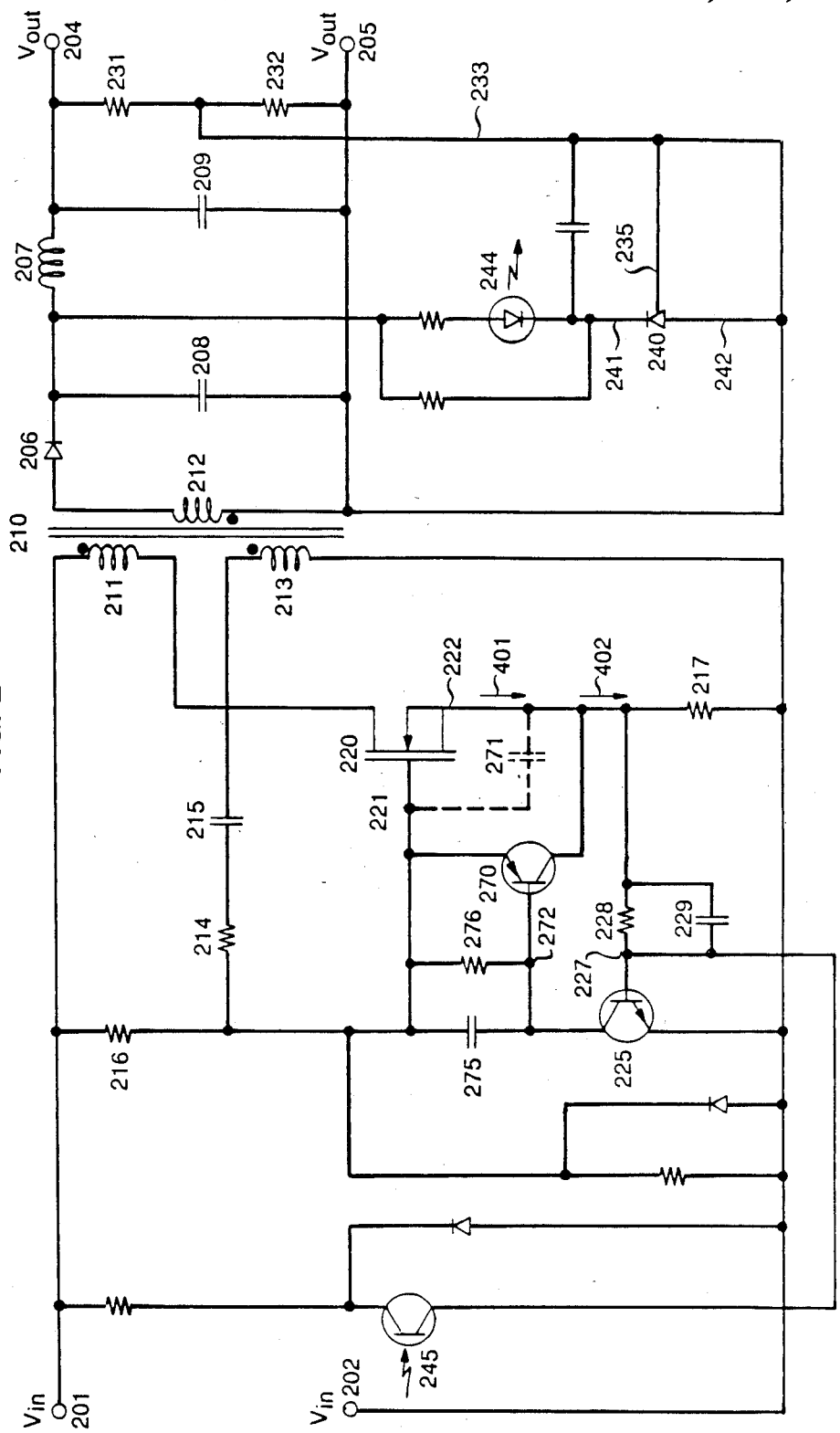
FIG. 2 is a schematic of a self-oscillating power converter embodying the principles of the invention to counteract bursting at low loads.

This inoperative condition at low load is solved in the circuit disclosed in FIG. 2 by the addition of circuitry to enhance the gain of turn off circuitry to turn off a MOSFET power switching device and counteract the miller effect induced on the turn off transistor by the gate-source capacitor 271. Added discharge current is applied to capacitor 271 to enhance turn on of the turn off transistor 225 in order to eliminate bursting at low loads. An illustrative embodiment of this circuitry is shown in the converter circuit schematically shown in FIG. 2. The converter shown in FIG. 2 generally operates similarly to that of FIG. 1 and hence the overall description of operation need not be repeated.

A supplementary drive transistor 270 is connected to couple the gate terminal 221 of the MOSFET power switching device 220 to the source terminal 222. Its control electrode 272 is connected to be responsive to the collector current from transistor 225. A capacitor 275 and a resistor 276 are connected in parallel with the base emitter junction of transistor 270. This supplementary drive transistor 270 is added to specifically increase the gain of transistor 225 and to regeneratively discharge the parasitic source to gate capacitance 271 and gate to drain capacitor of the MOSFET power switching device 220, and, to some extent, discharge the drive coupling capacitor 215. Once the discharge of the gate has begun, the added current through resistor 217 generates added voltage that is applied to accelerate the turn on of the turn off transistor 225 and hence further accelerate discharge of the gate-source capacitor 271 of transistor 220. Most of the regenerative current is from the discharge of the drain to gate capacitor and drive capacitor 215.

Figure 6:
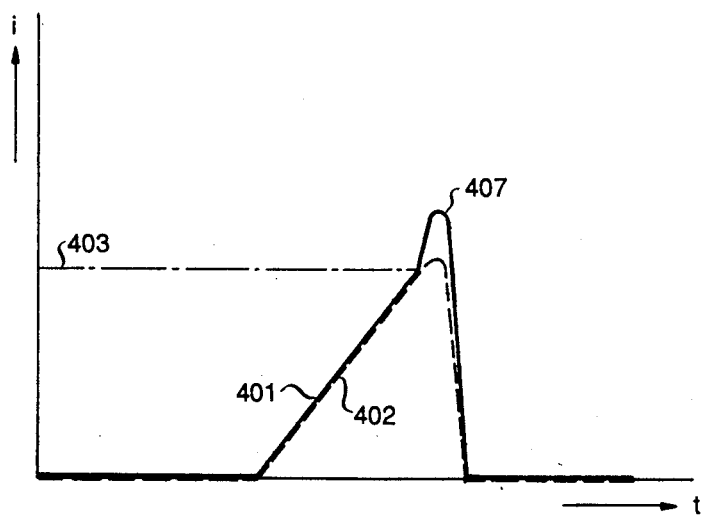
FIG. 6 shows voltage waveforms representing current flow in various components of the converter of FIG. 2.

This operation may be readily understood by referring to FIG. 6 which shows the voltage waveform of current 401 through the ideal MOSFET power switching device 220 and the current 402 driving shunt 217 and (through resistor 220 and capacitor 129) the base of transistor 225. The current waveforms 401 (dotted line) and 402 (solid line) are substantially coincident up to a threshold value 403. The supplementary drive transistor 270 provides a path to discharge gate-source capacitor 271 and drive capacitor 215. The current from the discharge of capacitor 215 (as well as other parasitic capacitances) provides a peak pulse waveform 407 which enhances the drive of turn off transistor 225. This prevents bursting at light loads by assuring a faster turn off of the MOSFET power switching device 220.

We claim:
1. A self oscillating converter comprising:
   an input for accepting a DC voltage source;
   an output for accepting a load to be energized;
   a MOSFET power switching device having significant interelectrode capacitance between gate and source electrodes, and with a main power conduction path connected for enabling energy flow from the input to the output;
   drive circuitry connected to the gate electrode for controlling the conduction state of the MOSFET power switching device including a bipolar turn-off transistor having its base-collector junction connected across the significant interelectrode capacitance of the MOSFET power switching device wherein the capacitance between gate and source electrodes may behave as a miller capacitance to a collector-base junction of the bipolar turnoff transistor switch;
   a regenerative feedback circuit for sustaining self oscillation of the converter; and operative for regeneratively driving the power switch through the drive circuitry; and
   means for enhancing the gain of the drive circuitry including;
   means for discharging stored charge from the source-gate capacitance of the gate electrode including a second bipolar transistor having its main conduction path in parallel only with the capacitance between gate and source electrodes in order to prevent charge on the capacitance between gate and source electrodes from inhibiting rapid turn off of the bipolar turn-off transistor at low output loads.

2. A self-oscillating converter as claimed in claim 1 wherein:
   a base emitter junction of the bipolar turn-off transistor sensing the MOSFET power switching device current is connected to a feedback control voltage; and
   the second bipolar transistor is responsive to the collector current of the bipolar turn off transistor.

3. A self-oscillating converter as claimed in claim 2 and further including
 a current sensing resistor connected in series with the MOSFET power switching device and operative for biasing the bipolar turn-off transistor into conduction; and
 the second bipolar transistor being responsive to the bipolar turnoff transistor and the bipolar turnoff transistor being operative to apply regenerative base current to the current sensing resistor.

4. A self oscillating converter as claimed in claim 3 and further including voltage regulation circuitry comprising:
 feedback circuitry for generating an error signal responsive to a deviation of the output voltage from its regulated value;
 summing circuitry for summing a voltage generated by the current sensing resistor with a voltage of the error signal and applying it to the turn-off transistor.

5. A converter circuit comprising:
 an input and an output;
 a transformer;
 a MOSFET power switch having significant source-gate capacitance, for coupling the input to the transformer, and which capacitance must be discharged to turn off the MOSFET power switch;
 a regenerative drive circuit for initiating conduction in the MOSFET power switch;
 a sensing resistor for sensing current flow through the MOSFET power switch;
 a feedback circuit responsive to a voltage at the output and operative to generate a feedback voltage;
 a first bipolar control transistor having its base-emitter junction responsive to a combination of the feedback voltage and a voltage across the sensing resistor, a second bipolar control transistor having its collector-emitter path coupled in parallel only with the source-gate capacitance and connecting a gate of the MOSFET power switch to the sensing resistor and being operative for enhancing a discharge current of the source-gate capacitance through the sensing resistor to enhance rapid turn-off of the first bipolar control transistor at low load conditions at the output.

6. a converter circuit as claimed in claim 5 and further comprising:
 a regenerative feedback winding coupled to a gate electrode of the MOSFET power switch and a base electrode of the second bipolar control transistor.

7. A self oscillating converter circuit, comprising:
 an input,
 an output,
 a MOSFET power switching device coupling the input to the output, and having significant source-gate capacitance,
 a current sensing resistor connected in series with the MOSFET power switching device,
 regenerative drive circuitry for driving the MOSFET power switching device and sustaining self oscillation,
 a MOSFET power switching device turn off circuit, including:
 a primary drive transistor connected to be biased into conduction by a voltage across the current sensing resistor and whose ability to rapidly turn off with a low load at the output is impaired by the source-gate capacitance of the MOSFET power switching device,
 a supplementary drive transistor connected in paralleled only with the source-gate capacitance of the MOSFET power switching device so as to direct discharge current of the source-gate capacitance into the current sensing resistor and operative for counteracting the effects of the source-gate capacitance as a miller capacitance on the primary drive transistor in causing bursting of the converter at low load by preventing periodic turnoff of the primary drive transistor.

* * * * *